United States Patent
Lee et al.

(10) Patent No.: US 10,825,951 B2
(45) Date of Patent: Nov. 3, 2020

(54) DISPLAY DEVICE

(71) Applicant: Samsung Display Co., Ltd., Yongin-si, Gyeonggi-do (KR)

(72) Inventors: Younghee Lee, Suwon-si (KR); Junewoo Lee, Yongin-si (KR); Sanggyun Kim, Hwaseong-si (KR); Jungho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/203,413

(22) Filed: Nov. 28, 2018

(65) Prior Publication Data

US 2019/0252576 A1 Aug. 15, 2019

(30) Foreign Application Priority Data

Feb. 12, 2018 (KR) .......................... 10-2018-0017007

(51) Int. Cl.
*H01L 33/06* (2010.01)
*G09G 3/32* (2016.01)
*H01L 25/075* (2006.01)
*H01L 27/15* (2006.01)
*H01L 33/00* (2010.01)
(Continued)

(52) U.S. Cl.
CPC .............. *H01L 33/06* (2013.01); *G09G 3/32* (2013.01); *H01L 25/0753* (2013.01); *H01L 27/156* (2013.01); *H01L 33/005* (2013.01); *H01L 33/36* (2013.01); *H01L 33/38* (2013.01); *H01L 33/44* (2013.01); *H01L 33/504* (2013.01); *H01L 33/507* (2013.01); *H01L 33/56* (2013.01); *H01L 33/20* (2013.01); *H01L 33/24* (2013.01);
(Continued)

(58) Field of Classification Search
CPC . H01L 25/0753; H01L 27/156; H01L 27/322; H01L 27/3241; H01L 27/3244; H01L 27/326; H01L 33/36; H01L 33/38; H01L 33/50; H01L 33/504; H01L 33/505; H01L 33/508
See application file for complete search history.

(56) References Cited

U.S. PATENT DOCUMENTS 6,433,487 B1 * 8/2002 Yamazaki ........... H01L 27/3281
315/169.3
9,337,407 B2 * 5/2016 Yao ..................... H01L 33/0079
(Continued)

FOREIGN PATENT DOCUMENTS

KR 10-2016-0113112 A 9/2016
KR 10-2017-0024905 A 3/2017
(Continued)

*Primary Examiner* — David C Spalla
(74) *Attorney, Agent, or Firm* — Lewis Roca Rothgerber Christie LLP

(57) ABSTRACT

A display device includes a substrate, a first electrode on the substrate, a light emitting element including: a first contact electrode connected to the first electrode, a first semiconductor layer on the first contact electrode, an active layer on the first semiconductor layer, a second semiconductor layer on the active layer, and a second contact electrode on the second semiconductor layer, a second electrode on the light emitting element, and a color conversion layer on the light emitting element and the second electrode, wherein an upper surface of the second contact electrode has a concavo-convex pattern.

18 Claims, 9 Drawing Sheets

(51) Int. Cl.
*H01L 33/36* (2010.01)
*H01L 33/44* (2010.01)
*H01L 33/50* (2010.01)
*H01L 33/56* (2010.01)
*H01L 33/38* (2010.01)
*H01L 33/42* (2010.01)
*H01L 33/20* (2010.01)
*H01L 33/24* (2010.01)
*H01L 33/54* (2010.01)
*H01L 33/62* (2010.01)

(52) U.S. Cl.
CPC ............ *H01L 33/42* (2013.01); *H01L 33/505* (2013.01); *H01L 33/54* (2013.01); *H01L 33/62* (2013.01)

(56) References Cited

U.S. PATENT DOCUMENTS

| | | | |
|---|---|---|---|
| 9,660,141 | B2 | 5/2017 | Koike |
| 9,780,256 | B2 | 10/2017 | Yang et al. |
| 2009/0179543 | A1* | 7/2009 | Fujimoto .......... G02F 1/133502 313/110 |
| 2014/0034981 | A1* | 2/2014 | Hung ..................... H01L 33/46 257/98 |
| 2016/0099385 | A1* | 4/2016 | Kim .................... H01L 33/0079 257/98 |
| 2017/0090095 | A1* | 3/2017 | Iwakura ................. H01L 33/44 |
| 2018/0190932 | A1* | 7/2018 | Koo .................... H01L 51/5209 |
| 2019/0245120 | A1* | 8/2019 | Choi ..................... H05B 33/12 |

FOREIGN PATENT DOCUMENTS

| KR | 10-2017-0036160 A | 4/2017 |
|---|---|---|
| KR | 10-2017-0110950 A | 10/2017 |
| KR | 10-1843627 B1 | 3/2018 |

* cited by examiner

DISPLAY DEVICE

CROSS-REFERENCE TO RELATED APPLICATION

This application claims priority to and the benefit of Korean Patent Application No. 10-2018-0017007, filed on Feb. 12, 2018, in the Korean Intellectual Property Office (KIPO), the disclosure of which is incorporated by reference herein in its entirety.

BACKGROUND

1. Field

Aspects of the present invention relate to a display device.

2. Description of the Related Art

A light emitting element (e.g., a light emitting diode ("LED")) is an element that converts electric signals into light, such as infrared light or visible light, using the characteristics of compound semiconductors. In particular, the LED is a semiconductor element in which holes and electrons are injected upon applying voltage to a P-N junction in a forward direction, and energy generated by recombination of holes and electrons is converted into light energy.

The LEDs may be used in mobile devices such as smart phones, laptop computers, digital cameras, camcorders, portable information terminals, tablet personal computers and watches, and other electronic devices such as desktop computers, televisions, outdoor billboards, display devices, dashboards of vehicles, and head up display (HUD) devices.

It is to be understood that this background section is intended to provide useful context for understanding the technology and as such, the background section may include ideas, concepts or recognitions that were not part of what was known or appreciated by those skilled in the pertinent art prior to a corresponding effective filing date of the present application.

SUMMARY

Aspects of embodiments of the present invention may be directed to a display device capable of improving luminous efficiency thereof.

According to some embodiments, there is provided a display device including: a substrate; a first electrode on the substrate; a light emitting element including: a first contact electrode connected to the first electrode; a first semiconductor layer on the first contact electrode; an active layer on the first semiconductor layer; a second semiconductor layer on the active layer; and a second contact electrode on the second semiconductor layer; a second electrode on the light emitting element; and a color conversion layer on the light emitting element and the second electrode, wherein an upper surface of the second contact electrode has a concavo-convex pattern.

In some embodiments, the concavo-convex pattern includes a plurality of convex portions and a plurality of concave portions, and wherein each of the plurality of convex portions has a shape of a cone or a polygonal pyramid.

In some embodiments, a hypotenuse of the convex portion has an angle of about 20 degrees to about 60 degrees with respect to a bottom surface of the convex portion.

In some embodiments, the concavo-convex pattern includes a plurality of convex portions and a plurality of concave portions, and each of the plurality of convex portions has a hemispherical shape or a polygonal shape in cross-section.

In some embodiments, the first semiconductor layer, the active layer, and the second semiconductor layer have a shape substantially the same as a shape of the second contact electrode.

In some embodiments, the first semiconductor layer includes an n-type semiconductor layer, and the second semiconductor layer includes a p-type semiconductor layer.

In some embodiments, the second contact electrode includes at least one of indium tin oxide (ITO), indium zinc oxide (IZO), zinc oxide (ZnO) and indium tin zinc oxide (ITZO)

In some embodiments, the display device further includes a thin film transistor on the substrate and connected to the first electrode.

In some embodiments, the color conversion layer includes a phosphor.

In some embodiments, the light emitting element is configured to emit blue light, and the color conversion layer includes: a red converter configured to absorb blue light and to emit red light; and a green converter configured to absorb blue light and to emit green light.

In some embodiments, the color conversion layer further includes a transmitter unit configured to transmit blue light.

In some embodiments, the display device further including a yellow color filter overlapping the red converter and the green converter.

According to some embodiments, there is provided a display device including: a substrate; a first electrode on the substrate; a light emitting element including: a first contact electrode connected to the first electrode; a first semiconductor layer on the first contact electrode; an active layer on the first semiconductor layer; a second semiconductor layer on the active layer; and a second contact electrode on the second semiconductor layer; a second electrode on the light emitting element; and a color conversion layer on the light emitting element and the second electrode, wherein an upper surface of the first contact electrode has a concavo-convex pattern.

In some embodiments, the concavo-convex pattern includes a plurality of convex portions and a plurality of concave portions, and each of the plurality of convex portions has a shape of a cone or a polygonal pyramid.

In some embodiments, an upper surface of the second contact electrode has a concavo-convex pattern, and the concavo-convex pattern of the first contact electrode and the concavo-convex pattern of the second contact electrode are positioned alternately with each other.

In some embodiments, the first semiconductor layer, the active layer, and the second semiconductor layer have a shape substantially the same as a shape of the second contact electrode.

In some embodiments, a hypotenuse of the convex portion has an angle of about 20 degrees to about 60 degrees with respect to a bottom surface of the convex portion.

In some embodiments, the concavo-convex pattern includes a plurality of convex portions and a plurality of concave portions, and each of the plurality of convex portions has a hemispherical shape or a polygonal shape in cross-section.

In some embodiments, the first semiconductor layer includes an n-type semiconductor layer, and the second semiconductor layer includes a p-type semiconductor layer.

In some embodiments, the first contact electrode includes a metal material including at least one of Ag, Mg, Al, Pt, Pd, Au, Ni, Nd, Ir, Cr, and Cu, and the second contact electrode includes at least one of indium tin oxide (ITO), indium zinc oxide (IZO), zinc oxide (ZnO), and indium tin zinc oxide (ITZO).

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in detail embodiments thereof with reference to the accompanying drawings, wherein.

DETAILED DESCRIPTION

Figure 1:
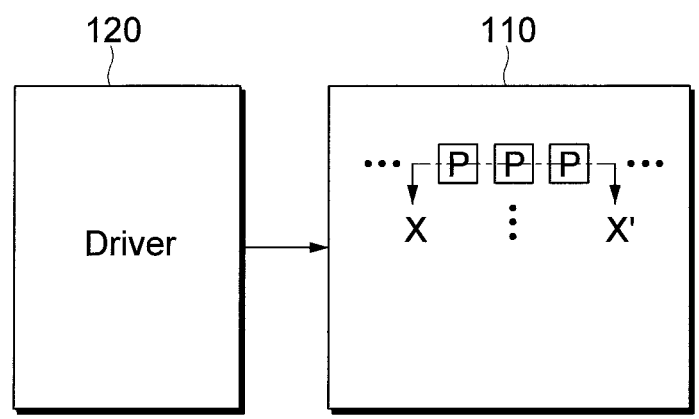
FIG. 1 is a block diagram illustrating a display device according to an embodiment of the present invention.

Embodiments will now be described more fully hereinafter with reference to the accompanying drawings. Although the invention may be modified in various suitable ways and may have several embodiments, some of exemplary embodiments are illustrated in the accompanying drawings and will be described in the specification. However, the scope of the invention is not limited to the embodiments and should be construed as including all the changes, equivalents and substitutions included within the spirit and scope of the invention.

In the drawings, thicknesses of a plurality of layers and areas are illustrated in an enlarged manner for clarity and ease of description thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts that are not particularly relevant to the description may not be provided for the sake of conciseness and clarity of description. Herein, like reference numerals refer to like elements throughout the specification.

Hereinafter, an embodiment of the present invention will be described with reference to FIGS. 1 to 5B.

Figure 2:
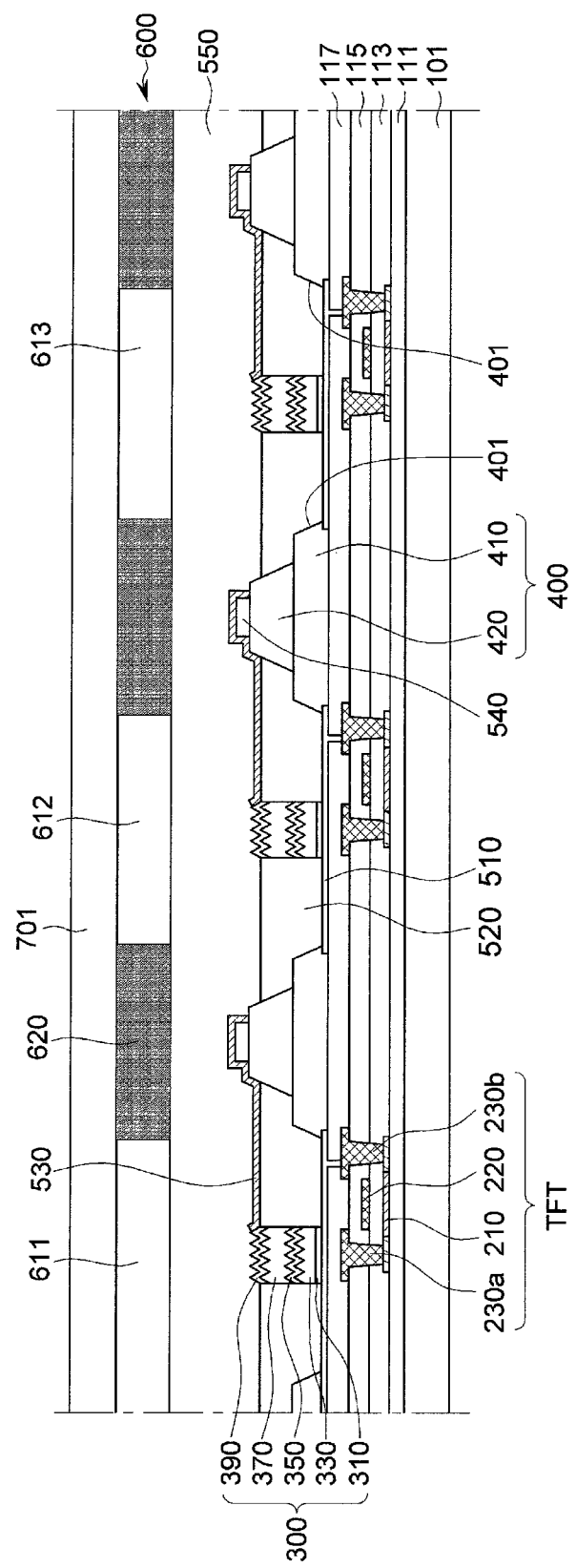
FIG. 2 is a cross-sectional view taken along the line X-X' of FIG. 1.
Figure 3:
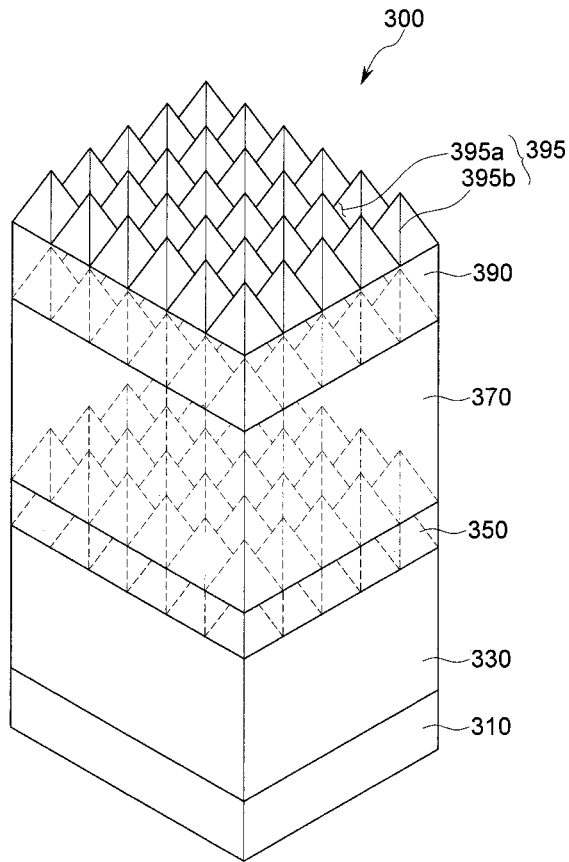
FIG. 3 is a perspective view illustrating one light emitting element.
Figure 4A:
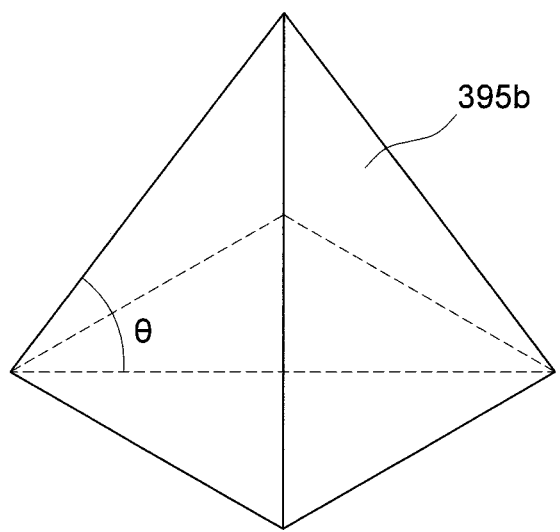
FIG. 4A is a perspective view enlarging a convex portion of the light emitting element according to an embodiment of the present invention.
Figure 4B:
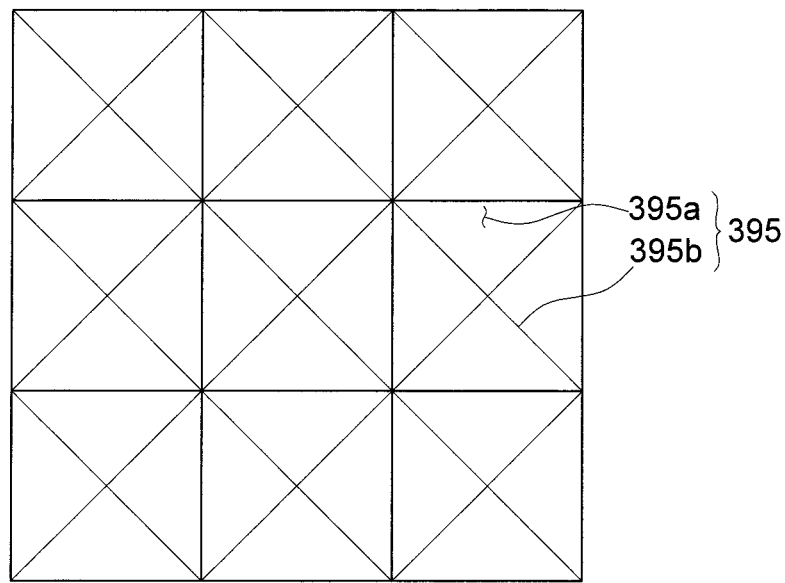
FIG. 4B is a plan view illustrating a light emitting element viewed from an upper surface of FIG. 3.

FIG. 1 is a block diagram illustrating a display device according to an embodiment of the present invention; FIG. 2 is a cross-sectional view taken along the line X-X' of FIG. 1; FIG. 3 is a perspective view illustrating one light emitting element; FIG. 4A is a perspective view enlarging a convex portion according to an embodiment of the present invention; and FIG. 4B is a plan view illustrating a light emitting element viewed from an upper surface of FIG. 3.

Referring to FIG. 1, a display device according to an embodiment of the present invention includes a display unit 110 and a driver 120.

The display unit 110 may include a plurality of pixels P arranged in a matrix form. Each of the plurality of pixels P includes a light emitting element 300 (hereinafter, light emitting diode ("LED")) to be described below.

The driver 120 applies a signal to the plurality of pixels P. The driver 120 may include a gate driver for applying a gate signal to a gate line connected to the pixel P and a data driver for applying a data signal to the data line. The driver 120 may be formed as an integrated circuit ("IC") chip to be mounted directly on a substrate on which the display unit 110 is formed, mounted on a flexible printed circuit film, attached to the substrate in the form of a tape carrier package ("TCP"), or may be formed directly on the substrate.

Referring to FIG. 2, the display device according to an embodiment of the present invention includes a substrate 101, a buffer layer 111, a thin film transistor ("TFT"), first to third insulating layers 113, 115, and 117, first and second electrodes 510 and 530, the LED 300, a bank layer 400, a passivation layer 520, a planarization layer 550, a color conversion layer 600, and an encapsulation layer 701.

The substrate 101 may include an insulating substrate, which includes glass, quartz, ceramic, plastic, and/or the like. For example, the substrate 101 may include a transparent glass material, which includes $SiO_2$ as a main component. In addition, the substrate 101 may include a transparent plastic material having flexibility. When the substrate 101 includes a plastic material, the substrate 101 may include polyethersulphone (PES), polyacrylate (PAR), polyetherimide (PEI), polyethylene naphthalate (PEN), polyethyeleneterephthalate (PET), polyphenylene sulfide (PPS), polyallylate, polyimide, polycarbonate (PC), cellulose triacetate (TAC), cellulose acetate propionate (CAP), and/or the like.

In the case of a bottom emission type where images are displayed toward the substrate 101, the substrate 101 is formed of a transparent material. However, in the case of a top emission type where images are displayed in a direction opposite to the substrate 101, it is not necessary that the substrate 101 includes a transparent material, and the substrate 101 may include a metal material such as stainless steel. When the substrate 101 includes a metal material, the substrate 101 may include iron, chromium, manganese, nickel, titanium, molybdenum, stainless steel (SUS), invar alloys, inconel alloys, kovar alloys, and/or the like.

The buffer layer 111 is disposed on the substrate 101. The buffer layer 111 may prevent, or reduce instances of, infiltration of foreign matter and planarize a surface therebelow, and may include various suitable material for playing such a role. For example, the buffer layer 111 may include one of silicon nitride ($SiN_x$), silicon oxide ($SiO_2$), and silicon oxynitride ($SiO_xN_y$). However, the buffer layer 111 is not invariably necessary and may be omitted.

The TFT is disposed on the buffer layer 111. The TFT includes an active layer 210, a gate electrode 220, a source electrode 230a, and a drain electrode 230b.

The active layer 210 may include amorphous silicon, poly crystalline silicon, oxide semiconductors, and/or the like. The oxide semiconductor may include oxides based on titanium (Ti), hafnium (Hf), zirconium (Zr), aluminum (Al), tantalum (Ta), germanium (Ge), zinc (Zn), gallium (Ga), tin (Sn), indium (In), composite oxides thereof such as zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), and/or the like. In the case where the active layer 210 includes an oxide semiconductor, a separate protective layer may be additionally provided to protect the oxide semiconductor from an external environment such as a high temperature.

The active layer 210 may include a source area and a drain area in contact with the source electrode 230a and the drain electrode 230b, respectively. For example, the source area and the drain area may be formed by doping a semiconductor material with an n-type impurity or a p-type impurity.

The first insulating layer 113 is disposed on the active layer 210. The first insulating layer 113 may be a gate insulating layer. The first insulating layer 113 serves to insulate the active layer 210 from the gate electrode 220. The first insulating layer 113 may include silicon nitride ($SiN_x$), silicon oxide ($SiO_2$), silicon oxynitride ($SiO_xN_y$), and/or the like.

The gate electrode 220 is disposed on the first insulating layer 113. The gate electrode 220 may be connected to a gate line for applying a gate signal to the TFT.

The gate electrode 220 may include a low-resistance metal material. The gate electrode 220 may be formed into a single-layer or mutli-layer structure including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or the like in consideration of adhesion to the adjacent layer, the surface flatness, and workability of the layer to be laminated.

The second insulating layer 115 is disposed on the gate electrode 220. The second insulating layer 115 serves to insulate the gate electrode 220 from the source electrode 230a and the drain electrode 230b. The second insulating layer 115 may be an organic insulating layer or an inorganic insulating layer such as silicon nitride ($SiN_x$), silicon oxide ($SiO_2$), silicon oxynitride ($SiO_xN_y$), and/or the like.

The source electrode 230a and the drain electrode 230b are disposed on the second insulating layer 115. Each of the source electrode 230a and the drain electrode 230b may have a single-layer or multi-layer structure including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or the like.

The source electrode 230a and the drain electrode 230b are electrically connected to a source area and a drain area of the active layer 210, respectively. For example, the source electrode 230a contacts the source area of the active layer 210 through a contact hole (or a contact opening) defined in the first insulating layer 113 and the second insulating layer 115, and the drain electrode 230b contacts the drain area of the active layer 210 through a contact hole (or a contact opening) defined in the first insulating layer 113 and the second insulating layer 115.

The third insulating layer 117 is disposed on the TFT. The third insulating layer 117 serves to protect the TFT and flatten an upper surface thereof.

The third insulating layer 117 may be an organic insulating layer or an inorganic insulating layer such as silicon nitride ($SiN_x$), silicon oxide ($SiO_2$), and silicon oxynitride ($SiO_xN_y$). For example, the third insulating layer 117 may include a photosensitive polymer resin.

The first electrode 510 is disposed on the third insulating layer 117. The first electrode 510 is electrically connected to the TFT. For example, the first electrode 510 may be electrically connected to the drain electrode 230b of the TFT through a contact hole (or a contact opening) defined in the third insulating layer 117. The first electrode 510 may have various suitable shapes, for example, may be patterned into an island shape.

The first electrode 510 includes a conductive material. For example, the first electrode 510 may include a conductive oxide such as indium tin oxide (ITO), indium zinc oxide (IZO), zinc oxide (ZnO), indium tin zinc oxide (ITZO), and/or the like, and/or a metal material including Ag, Mg, Al, Pt, Pd, Au, Ni, Nd, Ir, Cr, Cu, and/or the like. In addition, the first electrode 510 may have a multi-layer structure in which a plurality of layers are stacked.

In addition, the bank layer 400 defining a pixel area is disposed on the third insulating layer 117. The bank layer 400 defines an opening 401, and at least a part of the first electrode 510 is exposed from the bank layer 400 through the opening 401. The first electrode 510 overlaps at least a portion of the bank layer 400 and does not overlap the bank layer 400 in the opening 401. The opening 401 may be defined as a part of an area above the first electrode 510 that does not overlap the bank layer 400, or may be defined as an area in which the LED 300 is accommodated.

The bank layer 400 may include a first bank 410 and a second bank 420.

The height of the first and second banks 410 and 420 may be determined depending on the height and viewing angle of the LED 300. In addition, the size and shape of the opening 401 may be determined based on the resolution, the pixel density, and/or the like of the display device.

The first bank 410 and the second bank 420 may have a step difference (e.g., maybe positioned to form a step), and a width of the second bank 420 may be less than a width of the first bank 410. A conductive layer 540 may be disposed above the second bank 420. The conductive layer 540 may be disposed in a direction parallel to the data line or the gate line, and is electrically connected to the second electrode 530 to be described below.

However, embodiments of the present invention are not limited thereto, and the second bank 420 may be omitted, and the conductive layer 540 may be disposed on the first bank 410. In some examples, the second bank 420 and the conductive layer 500 may be omitted, and the second electrode 530 may be formed over the entire portion of the substrate 101 as a common electrode for applying a common voltage to the plurality of pixels P.

Each of the first and second banks 410 and 420 may include a material that absorbs at least a part of light, a light reflecting material, or a light scattering material. In addition, each of the first and second banks 410 and 420 may include an insulating material that is translucent or opaque to visible light (e.g., light in the wavelength range from about 380 nm to about 750 nm).

Each of the first and second banks 410 and 420 may include thermoplastic resins such as polycarbonate (PC), polyethylene terephthalate (PET), polyethersulfone, polyvinyl butyral, polyphenylene ether, polyamide, polyether imide, norbornene system resins, methacrylic resins, cylic polyolefin resins, an/or the like; thermocurable resins such as epoxy resins, phenol resins, urethane resins, acrylic resins, vinyl ester resins, imide resins, urethane resins, urea resins, melamine resins, and/or the like; and an organic insulating material such as polystyrene, polyacrylonitrile, polycarbonate, and/or the like; however, embodiments of the present invention are not limited thereto.

In some examples, the first and second banks 410 and 420 may include an inorganic insulating material such as inorganic nitrides and inorganic oxides, for example, $SiO_x$, $SiN_x$, $SiN_xO_y$, $AlO_x$, $TiO_x$, $TaO_x$, $ZnO_x$, and/or the like; however, embodiments of the present invention are not limited thereto.

In addition, the first and second banks 410 and 420 may include an opaque material such as a black matrix material. Examples of the insulating black matrix material may include resins (e.g., organic resins); pastes (e.g., glass pastes); black pigments; metal particles such as nickel, aluminum, molybdenum and alloys thereof; metal oxide particles (e.g., chromium oxide); metal nitride particles (e.g., chromium nitride); and/or the like. In some embodiments, the first and second banks 410 and 420 may be a mirror reflector including metal or a dispersed bragg reflector (DBR) having high reflectivity.

The LED 300 is disposed on the first electrode 510 that is exposed by the opening 401. The LED 300 is electrically connected to the first electrode 510. The LED 300 emits light having a wavelength of ultraviolet light, red light, green light, or blue light, and may realize white light by using a fluorescent material or combining colors. Hereinafter, the present invention will be described with respect to an embodiment in which an LED 300 that emits blue light is used.

The LED 300 has a width and a length in the scale of micrometers, and is also referred to as a micro LED. For example, the LED 300 may have a width and a length in the range from about 1 μm to about 100 μm; however, embodiments of the present invention are not limited thereto. Each of or the plurality of the LEDs 300 may be picked up from the wafer by a transfer mechanism and transferred to the substrate 101 to be accommodated in the opening 430 between the bank layers 400.

Referring to FIG. 3, the LED 300 includes a first semiconductor layer 330, an active layer 350 disposed on the first semiconductor layer 330, and a second semiconductor layer 370 disposed on the active layer 350. The LED 300 may have a rod shape, and, for example, may have a quadrangular column shape. However, embodiments of the present invention are not limited thereto, and the LED 300 may have various suitable shapes such as a cylinder, a triangular column, a hexagonal column, or the like.

The first semiconductor layer 330 may be an n-type semiconductor layer. For example, the first semiconductor layer 330 may include a semiconductor material having a composition formula of $In_xAl_yGa_{1-x-y}N$ (0=x=1, 0=y=1, and 0=x+y=1). In some examples, the first semiconductor layer 330 may be formed by doping a semiconductor material such as InAlGaN, GaN, AlGaN, InGaN, AlN, and InN with a dopant such as Si, Ge, or Sn. However, embodiments of the present invention are not limited thereto, and the semiconductor material and the dopant of the first semiconductor layer 330 may be determined according to the emission color of the LED 300.

The active layer 350 is disposed on the first semiconductor layer 330. The active layer 350 may be formed into a single or multiple quantum well structure. When a voltage is applied to the LED 300, light is emitted by electron-hole coupling in the active layer 350. For example, the active layer 350 may include a semiconductor material having a composition formula of $In_xAl_yGa_{1-x-y}N$ (0=x=1, 0=y=1, and 0=x+y=1). For example, the active layer 350 may include a semiconductor material such as AlGaN, AlInGaN, and/or the like.

The second semiconductor layer 370 is disposed on the active layer 350. The second semiconductor layer 370 may be a p-type semiconductor layer. For example, the second semiconductor layer 370 may include a semiconductor material having a composition formula of $In_xAl_yGa_{1-x-y}N$ ($0 \leq X \leq 1$, $0 \leq Y \leq 1$, and $0 \leq X \leq 1$).

For example, the second semiconductor layer 370 may be formed by doping a semiconductor material such as InAlGaN, GaN, AlGaN, InGaN, AlN, and InN with a dopant such as Mg. However, embodiments of the present invention are not limited thereto, and the semiconductor material and the dopant of the second semiconductor layer 370 may be determined according to the emission color of the LED 300.

The LED 300 may further include a clad layer between the first semiconductor layer 330 and the active layer 350 or between the active layer 350 and the second semiconductor layer 370. The clad layer may be formed by doping a semiconductor material such as AlGaN and InAlGaN with a conductive dopant. Because the LED 300 further includes the clad layer, luminous efficiency may be improved.

In addition, the LED 300 may further include an insulating layer that covers at least a portion of outer surfaces of the first semiconductor layer 330, the active layer 350, and the second semiconductor layer 370. For example, the insulating layer may be disposed at a remaining portion except for a portion where the LED 300 and the first and second electrodes 510 and 530 are electrically connected to each other. Because the LED 300 further includes an insulating layer, a short circuit between the active layer 350 and the first and second electrodes 510 and 530 may be substantially prevented (or instances thereof may be reduced), the durability of the LED 300 may be improved, and degradation of the luminous efficiency due to the physical damage of the LED 300 may be substantially prevented or substantially reduced.

As illustrated in FIG. 3, the LED 300 further includes a first contact electrode 310 below the first semiconductor layer 330 and a second contact electrode 310 above the second semiconductor layer 370.

The first contact electrode 310 and the second contact electrode 390 may include a conductive oxide or a metal material used for a typical electrode. For example, each of the first and second contact electrodes 310 and 390 may include a conductive oxide such as indium tin oxide (ITO), indium zinc oxide (IZO), zinc oxide (ZnO), indium tin zinc oxide (ITZO), and/or the like, and/or a metal material including Ag, Mg, Al, Pt, Pd, Au, Ni, Nd, Ir, Cr, Cu, and/or the like.

The first and second contact electrodes 310 and 390 may serve as an ohmic contact layer. That is, because the LED 300 includes the first and second contact electrodes 310 and 390, a separate ohmic contact layer may not be formed at a portion where the LED 300 is connected to the first and second electrodes 510 and 530 on the substrate 101.

An upper surface of the LED 300 according to an embodiment of the present invention has a concavo-convex pattern 395. In other words, the second contact electrode 390 of the LED 300 has the concavo-convex pattern 395. In addition, as illustrated in FIG. 3, the first semiconductor layer 330, the active layer 350, and the second semiconductor layer 370 may also have a concavo-convex pattern in the shape that is the same as or substantially the same as that of the second contact electrode 390.

In addition, each LED 300 is formed through a process of stacking and etching a plurality of thin films. In such an embodiment, each of the first semiconductor layer 330, the active layer 350, the second semiconductor layer 370, and the second contact electrode 390 is etched so that an upper surface of the LED 300 has the concavo-convex pattern 395.

The concavo-convex pattern 395 includes a plurality of concave portions 395a and a plurality of convex portions 395b.

Referring to FIGS. 4A and 4B, each of the plurality of convex portions 395b according to an embodiment of the present invention may have a quadrangular pyramid shape. In the case where each convex portion 395b has the shape of a quadrangular pyramid, the hypotenuse of the quadrangular pyramid may have an angle θ in the range from about 20 degrees to about 60 degrees with respect to the bottom surface of the quadrangular pyramid. Accordingly, light emitted from the LED 300 may be incident to the color conversion layer 600 (which will be described further below) at a set or predetermined angle.

Because the LED 300 that emits light to the color conversion layer 600 has the concavo-convex pattern on the upper surface thereof, the color conversion efficiency may be improved in the color conversion layer 600, which will be described in detail below.

Referring again to FIG. 2, the passivation layer 520 is disposed surrounding the LED 300. The passivation layer 520 fills the space between the bank layer 400 and the LED 300 to cover the first electrode 510 that is exposed by the opening 401. The passivation layer 520 may include an organic insulating material. For example, the passivation layer 520 may include acryl, poly (methyl methacrylate) (PMMA), benzocyclobutene (BCB), polyimide, acrylate, epoxy, polyester, and/or the like, but embodiments of the present invention are not limited thereto The passivation layer 520 is disposed to have a height that does not cover an upper portion of the LED 300, that is, the second contact electrode 390. Accordingly, at least a part of the second contact electrode 390 is exposed from the passivation layer 520. The second electrode 530 that is electrically connected to the conductive layer 540 and the second contact electrode 390 of the LED 300 is disposed on the passivation layer 520.

The second electrode 530 includes a conductive material. For example, the second electrode 530 may include a conductive oxide such as indium tin oxide (ITO), indium zinc oxide (IZO), zinc oxide (ZnO), indium tin zinc oxide (ITZO), and/or a metal material including Ag, Mg, Al, Pt, Pd, Au, Ni, Nd, Ir, Cr, Cu, and/or the like. In addition, the second electrode 530 may have a multi-layer structure in which a plurality of layers are stacked.

The planarization layer 550 is disposed on the passivation layer 520 and the second electrode 530. The planarization layer 550 may include an organic insulating material. For example, the planarization layer 550 may include acryl, poly (methyl methacrylate) (PMMA), benzocyclobutene (BCB), polyimide, acrylate, epoxy, polyester, and/or the like; however, embodiments of the present invention are not limited thereto.

The encapsulation layer 701 is disposed on the planarization layer 550. The encapsulation layer 701 may be an encapsulation substrate, an encapsulation film or a thin film encapsulation layer. For example, when the encapsulation layer 701 is an encapsulation film, the encapsulation layer 701 may include a polyethylene (PET) film, a polypropylene (PP) film, a polyamide (PA) film, a polyacetal (POM) film, a polymethyl methacrylate (PMMA) film, a polybutylene terephthalate (PBT) film, a polycarbonate (PC) film, a cellulose film, a moisture-proof cellophane, and/or the like. In addition, when the encapsulation layer 701 is a thin film encapsulation layer, the encapsulation layer 701 may include at least one inorganic layer that is arranged alternately with at least one organic layer.

The color conversion layer 600 is disposed between the planarization layer 550 and the encapsulation layer 701. In addition, the display device according to an embodiment of the present invention may further include a polarizing layer disposed between the planarization layer 550 and the color conversion layer 600.

The color conversion layer 600 converts the wavelength of light incident from the LED 300 to emit light having a different wavelength. As illustrated in FIG. 2, the color conversion layer 600 includes a plurality of color conversion units 611 and 612 and a transmission unit (e.g., a transmitter) 613.

The color conversion units 611 and 612 and the transmission unit 613 may be separated from each other by a light blocking layer 620. For example, each of the color conversion units 611 and 612 and the transmission unit 613 may be positioned at the opening of the light blocking layer 620 corresponding to the LED 300. In such an embodiment, at least a part of the color conversion units 611 and 612 and the transmission unit 613 may be disposed so as to overlap the light blocking layer 620.

The color conversion units 611 and 612 include a first color conversion unit 611, which is a red conversion unit (e.g., a red converter) corresponding to a red pixel, and a second color conversion unit 612, which is a green conversion unit (e.g., a green converter) corresponding to a green pixel. The red conversion unit emits red light, and the green conversion unit emits green light.

For example, the first color conversion unit 611, which is a red conversion unit, includes a red phosphor, and the second color conversion unit 612, which is a green conversion unit, includes a green phosphor. According to an embodiment of the present invention, the red phosphor absorbs blue light to emit red light, and the green phosphor absorbs blue light to emit green light. The color conversion layer 600 may further include a third color conversion unit that absorbs blue light and emits light other than red and green. For example, the third color conversion unit may be a blue color conversion unit corresponding to a blue pixel.

The transmission unit 613 according to an embodiment of the present invention transmits blue light. That is, the wavelength of light passing through the transmission unit 613 does not change. Accordingly, when the LED 300 emits blue light, the transmission unit 613 may correspond to a blue pixel. In order to improve the side viewing angle characteristics, the transmission unit 613 may include light scattering particles.

The color conversion units 611 and 612 may include a resin including phosphors. The phosphor is a substance that emits fluorescence when irradiated with light or radiation, and emits light having a specific wavelength of the phosphor. Further, the phosphor emits light to the entire area regardless of the direction of the incident light. According to an embodiment of the present invention, quantum dots may be used as the phosphor. In such an embodiment, the quantum dot is not limited to a spherical shape but may have a shape such as a rod, a pyramid, a multi-arm, a cubic nanoparticle, a nanotube, a nanowire, a nanofiber, and a nanoplate.

The quantum dot absorbs light incident thereto and emits light having a different wavelength from a wavelength of the incident light. That is, the quantum dot is a wavelength converting particle that may convert the wavelength of light incident to the quantum dot. A wavelength range of light that a quantum dot may convert may vary depending on the size of the quantum dot. For example, by adjusting the diameter of the quantum dot, the quantum dot may emit light of a desired color.

In general, the quantum dot has a high extinction coefficient and a high quantum yield, thus emitting significantly intense fluorescence. For example, the quantum dot may absorb light of a short wavelength and then may emit light of a longer wavelength. The quantum dot may have a full width of half maximum (FWHM) of the emission wavelength spectrum of about 45 nm or less, for example, about 40 nm or less, or about 30 nm or less, and the color purity or color reproducibility may be improved in the above range. In addition, because light emitted through the quantum dots is emitted in all directions, a viewing angle may be improved.

The quantum dot may have a structure including a core nanocrystal and a shell nanocrystal surrounding the core nanocrystal. In addition, the quantum dot may include an organic ligand bonded to the shell nanocrystal and may include an organic coating layer surrounding the shell nanocrystal. The shell nanocrystal may be formed having two or more layers. The shell nanocrystal is placed on the surface of the core nanocrystal. In such an embodiment, an interface between the core nanocrystal and the shell nanocrystal may have a concentration gradient, that is, the concentration of element existing in the shell nanocrystal becomes lower toward the center.

The quantum dot may include Group II compound semiconductors, Group III compound semiconductors, Group IV compound semiconductors, Group V compound semiconductors, Group VI compound semiconductors, and/or the like. For example, the quantum dot may be selected from Group II-VI compounds, Group III-V compounds, Group IV-VI compounds, Group IV elements, Group IV compounds, and combinations thereof.

For example, the Group II-VI compound may be selected from the group consisting of: a binary compound of CdO, CdS, CdSe, CdTe, ZnO, ZnS, ZnSe, ZnTe, HgS, HgSe, HgTe, MgSe, MgS and mixtures thereof; a ternary compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound of CdZnSeS, CdZnSeTe, CdZnSTe, CdHgSeS, CdHgSeTe, CdHgSTe, HgZnSeS, HgZnSeTe, HgZnSTe, and mixtures thereof. The Group III-V compound may be selected from the group consisting of: a binary compound of GaN, GaP, GaAs, GaSb, AlN, AlP, AlAs, AlSb, InN, InP, InAs, InSb, and mixtures thereof; a ternary compound of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; and a quaternary compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group IV-VI compound may be selected from the group consisting of: a binary compound of SnS, SnSe, SnTe, PbS, PbSe, PbTe, and mixtures thereof; a ternary compound of SnSeS, SnSeTe, SnSTe, PbSeS, PbSeTe, PbSTe, SnPbS, SnPbSe, SnPbTe, and mixtures thereof; and a quaternary compound of SnPbSSe, SnPbSeTe, SnPbSTe, and mixtures thereof. The Group IV element may be selected from the group consisting of Si, Ge, and mixtures thereof. The Group IV compound may be selected from the group consisting of SiC, SiGe, and mixtures thereof.

In such an embodiment, the binary compound, the ternary compound, or the quaternary compound may be present in the particle at a uniform concentration, or the concentration distributions thereof may be partially different in the same particle.

Even quantum dots of the substantially same composition may produce different lights depending on their diameters. For example, in the case where the core nanocrystal includes CdSe, blue light may be generated when the diameter of the quantum dots is in the range from about 1 nm to about 3 nm, green light may be generated when the diameter of the quantum dots is in the range from about 3 nm to about 5 nm, and red light may be generated when the diameter of the quantum dots is in the range from about 7 nm to about 10 nm.

In the display device according to an embodiment of the present invention, because the LED 300 that emits light to the color conversion layer 600, including phosphors such as quantum dots, has the concavo-convex pattern 395, the path of light passing through the color conversion layer 600 may be lengthened, and accordingly, luminous efficiency may be improved.

Figure 5A:
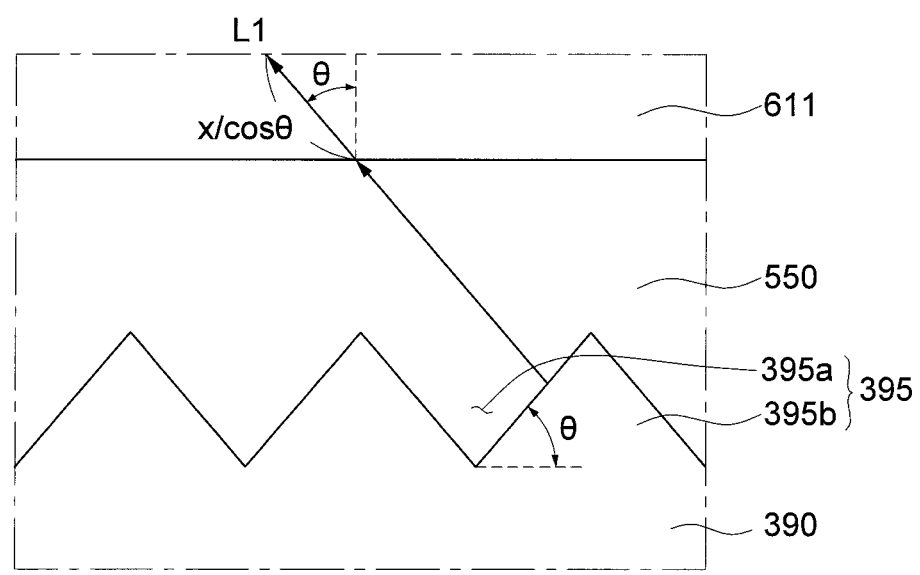
FIGS. 5A-5B are cross-sectional views for illustrating light conversion according to some embodiments of the present invention.
Figure 5B:
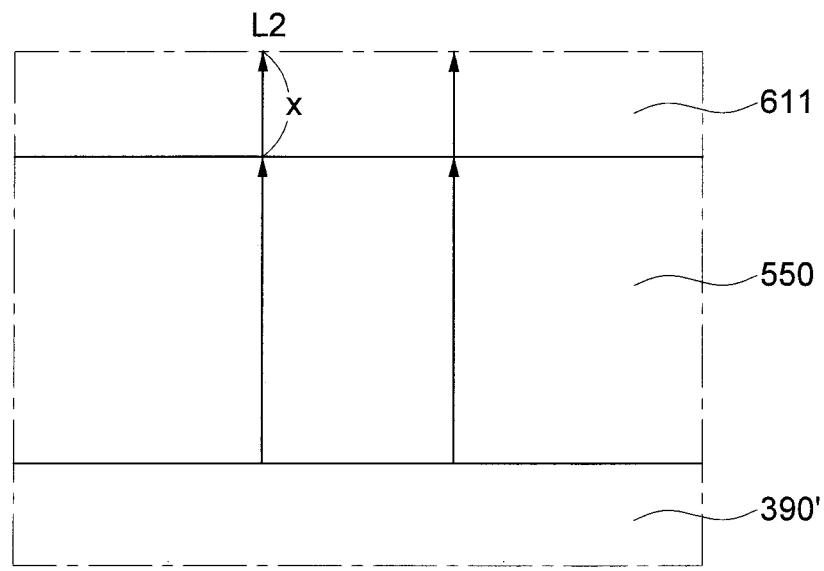

FIGS. 5A and 5B are cross-sectional views for illustrating light conversion according to some embodiments of the present invention.

Referring to FIG. 5A, the second contact electrode 390 according to an embodiment of the present invention includes the concavo-convex pattern 395 on its upper surface, and the concavo-convex pattern 395 includes the plurality of concave portions 395a and the plurality of convex portions 395b. Each of the plurality of convex portions 395b may have a quadrangular pyramid shape and may have a triangular shape in vertical cross-section (i.e., a cross-section perpendicular to the bottom surface of the quadrangular pyramid).

As described above, when each convex portion 395b has a quadrangular pyramid shape, the hypotenuse of the quadrangular pyramid may have an angle θ ranging from about 20 degrees to about 60 degrees with respect to the bottom surface of the quadrangular pyramid. Accordingly, a light L1 emitted from the LED 300 is incident to the color conversion unit 611 with a set or predetermined angle. For example, the light L1 emitted from the LED 300 is incident so as to have an angle ranging from about 20 degrees to about 60 degrees with respect to a straight line perpendicular to the color conversion unit 611.

On the other hand, referring to FIG. 5B, a conventional second contact electrode 390' has a flat upper surface. Accordingly, most of light L2 emitted from the LED 300 may be incident to the color conversion unit 611 perpendicularly.

Assuming that the thickness of the color conversion unit 611 is substantially equal to x, the length of a path of the light L1 passing through the color conversion unit 611 in FIG. 5A may be about x/cos θ, and the length of a path of the light L2 passing through the color conversion unit 611 in FIG. 5B may be about x, which is equal to or substantially equal to the thickness of the color conversion unit 611. In such an embodiment, x/cos θ is substantially equal to or greater than x.

That is, according to an embodiment of the present invention, because the upper surface of the LED 300 has the concavo-convex pattern 395, which includes the convex portion 395b in the form of a quadrangular pyramid, the light L1 emitted from the LED 300 may be incident to the color conversion unit 611 with a set or predetermined angle and the length of the path of the light L1 that passes through the color conversion unit 611 may be increased.

As the length of the path of the light L1 that passes through the color conversion unit 611 increases, the light conversion efficiency in the color conversion unit 611 may be improved. In addition, because the light L1 emitted from the LED 300 is incident to the color conversion unit 611 through a wider area, the utilization area of the color conversion unit 611 may be increased, and accordingly, the lifetime of the phosphor included in the color conversion unit 611 may be increased.

Hereinafter, other embodiments of the present invention will be described with reference to FIGS. 6A to 9. The description of the same configuration as that of a previously-described embodiment of the present invention may be omitted for convenience of explanation.

FIGS. 6A to 7B are perspective views and plan views enlarging convex portions of the light emitting element according to some embodiments of the present invention.

Figure 6A:
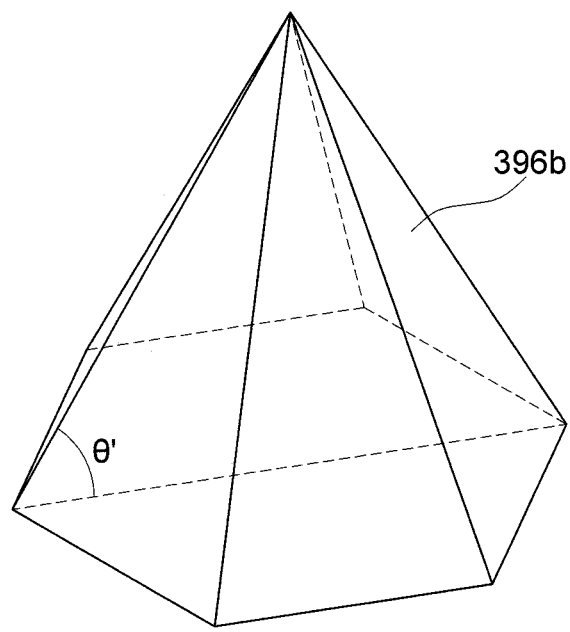
FIGS. 6A-7B are perspective views and plan views enlarging convex portions of the light emitting element according to some embodiments of the present invention.
Figure 6B:
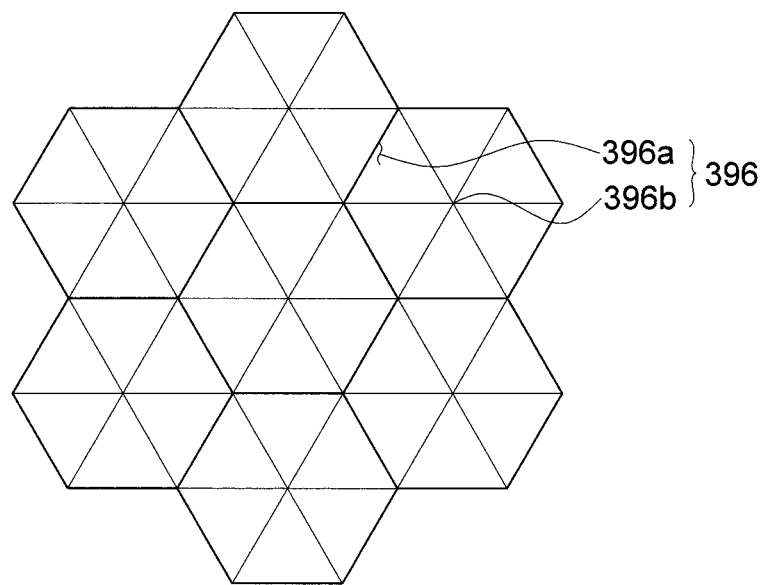

Referring to FIGS. 6A and 6B, a concavo-convex pattern 396 according to another embodiment of the present invention includes a plurality of concave portions 396a and a plurality of convex portions 396b, and each of the plurality of convex portions 396b may have a hexagonal pyramid shape and may have a triangular shape in vertical cross-section.

Figure 7A:
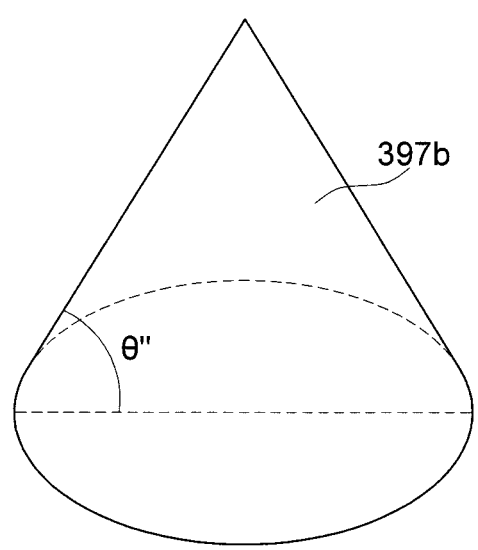
Figure 7B:
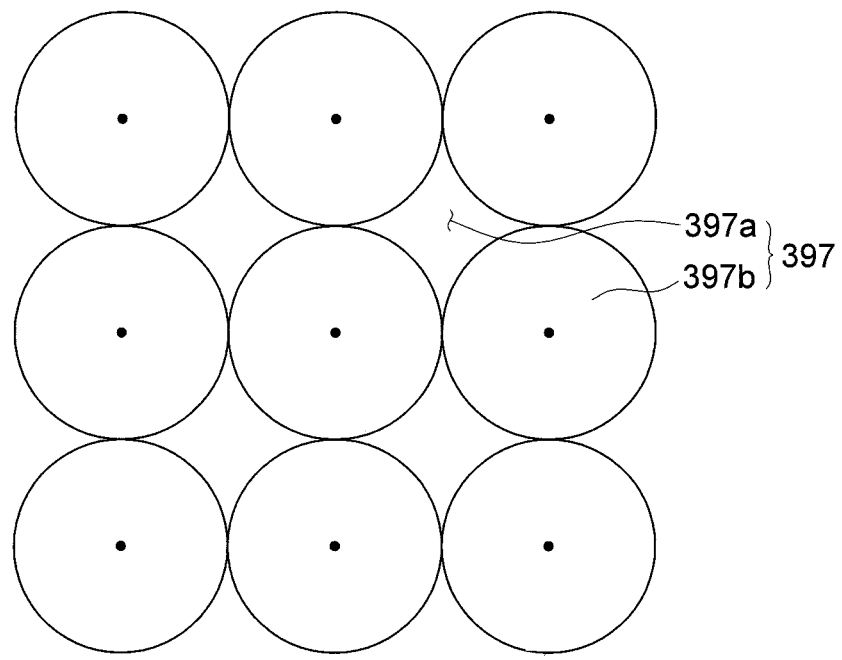

Referring to FIGS. 7A and 7B, a concavo-convex pattern 397 according to still another embodiment of the present invention includes a plurality of concave portions 397a and a plurality of convex portions 397b, and each of the plurality of convex portions 397b may have a circular pyramid shape (e.g., a cone shape) and may have a triangular shape in vertical cross-section.

When each of the convex portions 396b has a hexagonal pyramid shape, the hypotenuse of the hexagonal pyramid may have an angle θ' ranging from about 20 degrees to about 60 degrees with respect to the bottom surface of the hexagonal pyramid. Accordingly, a light emitted from the LED 300 is incident to the color conversion unit 611 with a set or predetermined angle. For example, the light emitted from the LED 300 is incident so as to have an angle in the range from about 20 degrees to about 60 degrees with respect to a straight line perpendicular to the color conversion unit 611.

Similarly, when each of the convex portions 397b has a circular pyramid shape (e.g., a cone shape), the hypotenuse of the circular pyramid may have an angle θ'' ranging from about 20 degrees to about 60 degrees with respect to the bottom surface of the circular pyramid. Accordingly, a light emitted from the LED 300 is incident to the color conversion unit 611 with a set or predetermined angle. For example, the light emitted from the LED 300 is incident so as to have an angle in the range from about 20 degrees to about 60 degrees with respect to a straight line perpendicular to the color conversion unit 611.

According to other embodiments of the present invention, because an upper surface of the LED 300 has the concavo-convex patterns 396 and 397 that include the convex portions 396b and 397b of hexagonal and circular pyramid shapes, respectively, the light emitted from the LED 300 may be incident to the color conversion unit 611 having a set or predetermined angle, and the length of a path of light passing through the color conversion unit 611 may be increased.

As the length of the path of the light that passes through the color conversion unit 611 increases, the light conversion efficiency in the color conversion unit 611 may be improved. In addition, because the light emitted from the LED 300 is incident to the color conversion unit 611 through a wider area, the utilization area of the color conversion unit 611 may be increased, and accordingly, the lifetime of the phosphor included in the color conversion unit 611 may be increased.

Figure 8:
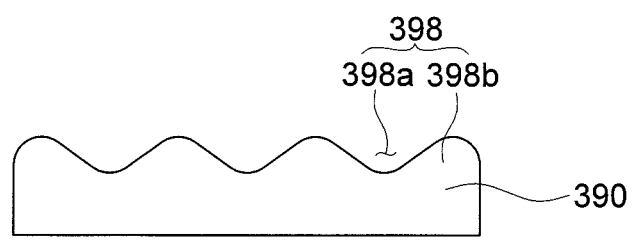
FIGS. 8-9 are schematic cross-sectional views illustrating second contact electrodes according to still other embodiments of the present invention.
Figure 9:
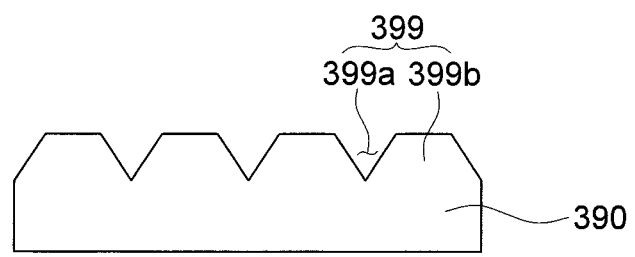

FIGS. 8 and 9 are schematic cross-sectional views illustrating second contact electrodes according to still other embodiments of the present invention.

Referring to FIGS. 8 and 9, the second contact electrodes 390 according to still other embodiments of the present invention include concavo-convex patterns 398 and 399 on their upper surfaces, respectively. The concavo-convex patterns 398 and 399 include pluralities of concave portions 398a and 399a and pluralities of convex portions 398b and 399b, respectively. For example, the second contact electrode 390 may include the plurality of convex portions 398b each having a hemispherical shape in cross-section, or may include the plurality of convex portions 399b each having a trapezoidal shape in cross-section. However, the shapes of the convex portions 398b and 399b according to the present invention are not limited thereto, and the convex portions 398b and 399b may have various suitable shapes whereby the light emitted from the LED 300 may be incident to the color conversion portion 611 at a set or predetermined angle.

Because the light emitted from the LED 300 is incident to the color conversion unit 611 with a set or predetermined angle, the length of a path of the light that passes through the color conversion unit 611 may be increased, and the light conversion efficiency in the color conversion unit 611 may be improved.

Hereinafter, still another embodiment of the present invention will be described with reference to FIG. 10. The description of the same configuration as that of a previously-described embodiment of the present invention may be omitted for the convenience of explanation.

Figure 10:
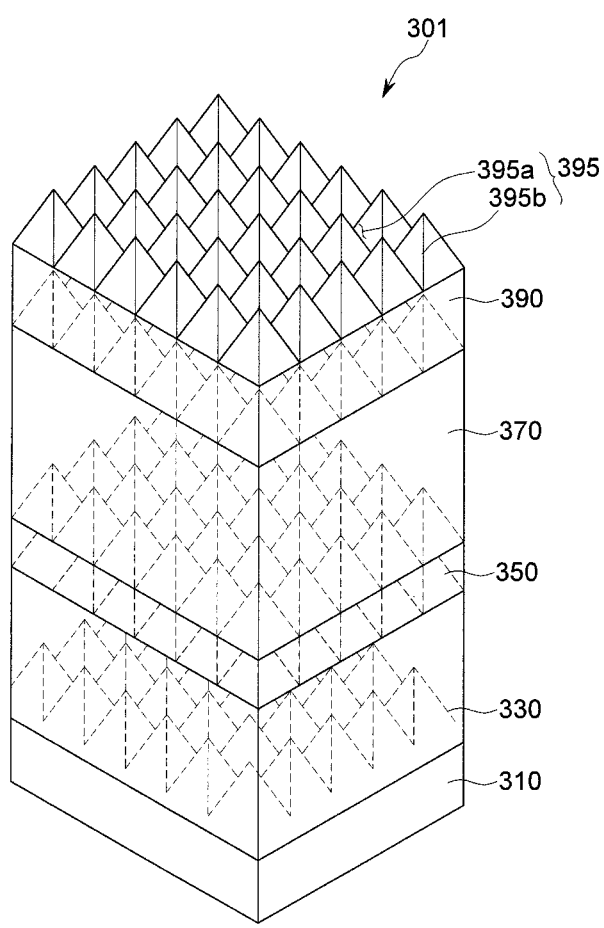
FIG. 10 is a perspective view illustrating one light emitting element according to still another embodiment of the present invention.

FIG. 10 is a perspective view illustrating one LED according to still another embodiment of the present invention.

A first contact electrode 310 of an LED 301 according to still another embodiment of the present invention includes a metal material so that light emitted from an active layer 350 to propagate to a back surface thereof is reflected from the back surface to re-propagate toward an upper surface thereof. For example, the first contact electrode 310 may include a metal material including Ag, Mg, Al, Pt, Pd, Au, Ni, Nd, Ir, Cr, Cu, and/or the like. On the other hand, a second contact electrode 390 may include a conductive oxide. For example, the second contact electrode 290 may include a conductive oxide such as indium tin oxide (ITO), indium zinc oxide (IZO), zinc oxide (ZnO) indium tin zinc oxide (ITZO), an/or the like.

In addition, the first contact electrode 310 includes a concavo-convex pattern to improve reflection efficiency. In such an embodiment, the concavo-convex pattern of the first contact electrode 310 may be disposed alternately with a concavo-convex pattern of the second contact electrode 390. However, embodiments of the present invention are not limited thereto, and the concavo-convex pattern of the first contact electrode 310 and the concavo-convex pattern of the second contact electrode 390 may have a substantially same shape.

Hereinafter, still another embodiment of the present invention will be described with reference to FIG. 11. The description of the same configuration as that of a previously-described embodiment of the present invention may be omitted for convenience of explanation.

Figure 11:
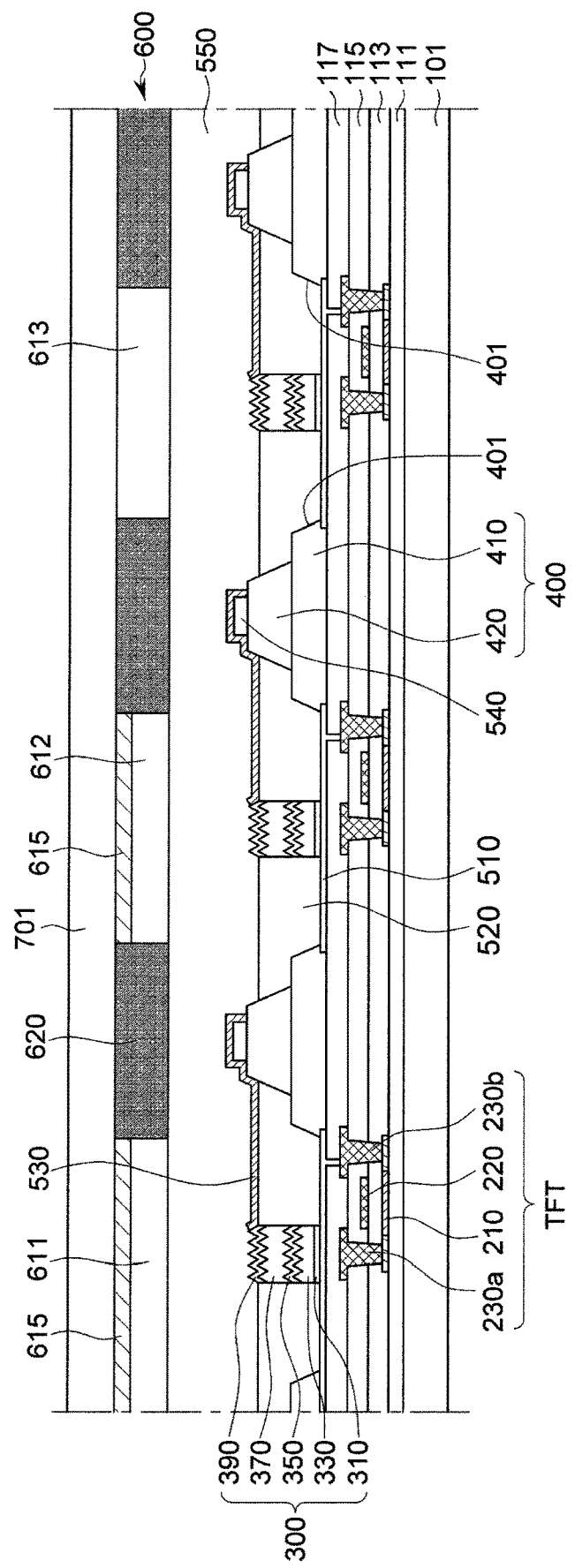
FIG. 11 is a cross-sectional view illustrating a display device according to still another embodiment of the present invention.

FIG. 11 is a cross-sectional view illustrating a display device according to still another embodiment of the present invention.

Referring to FIG. 11, a color conversion layer 600 according to still another embodiment of the present invention may further include a yellow color filter 615.

The yellow color filter 615 is disposed between first and second color conversion units 611 and 612 and an encapsulation layer 701. The yellow color filter 615 absorbs blue light and transmits red light and green light.

When blue light emitted from an LED 300 is incident to the color conversion layer 600, between the blue light incident to the first color conversion unit 611, light converted into red light is transmitted through the yellow color filter 615, and the blue light that is not converted into red light is absorbed by the yellow color filter 615. In addition, between the blue light incident to the second color conversion unit 612, light converted into green light is transmitted through the yellow color filter 615, and the blue light that is not converted into green light is absorbed by the yellow color filter 615. Accordingly, clear red and green are distinctly realized in the red and green pixels, respectively, and the display quality of the display device may be improved.

As set forth hereinabove, according to one or more embodiments of the present invention, the display device includes an LED having a concavo-convex pattern, such that the light emission efficiency may be improved.

The spatially relative terms "below", "beneath", "less", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components, such as the driver, according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While the present invention has been illustrated and described with reference to the embodiments thereof, it will be apparent to those of ordinary skill in the art that various suitable changes in form and detail may be formed thereto without departing from the spirit and scope of the present invention, as defined by the following claims and equivalents thereof.

What is claimed is:

1. A display device comprising:
   a substrate;
   a first electrode on the substrate;
   a light emitting element comprising:
      a first contact electrode connected to the first electrode;
      a first semiconductor layer having a concavo-convex top surface and a flat bottom surface on the first contact electrode;
      an active layer on the first semiconductor layer such that the concavo-convex top surface of the first semiconductor layer faces toward the active layer;
      a second semiconductor layer on the active layer; and
      a second contact electrode on the second semiconductor layer;
   a second electrode on the light emitting element; and
   a color conversion layer on the light emitting element and the second electrode,
   wherein an upper surface of the second contact electrode has a concavo-convex pattern, and
   the first contact electrode, the first semiconductor layer, the active layer, and the second semiconductor layer have a shape substantially the same as a shape of the second contact electrode in a plan view.

2. The display device of claim 1, wherein the concavo-convex pattern comprises a plurality of convex portions and a plurality of concave portions, and
   wherein each of the plurality of convex portions has a shape of a cone or a polygonal pyramid.

3. The display device of claim 2, wherein a hypotenuse of the convex portion has an angle of about 20 degrees to about 60 degrees with respect to a bottom surface of the convex portion.

4. The display device of claim 1, wherein the concavo-convex pattern comprises a plurality of convex portions and a plurality of concave portions, and
   wherein each of the plurality of convex portions has a hemispherical shape or a polygonal shape in cross-section.

5. The display device of claim 1, wherein the first semiconductor layer comprises an n-type semiconductor layer, and the second semiconductor layer comprises a p-type semiconductor layer.

6. The display device of claim 1, wherein the second contact electrode comprises at least one of indium tin oxide (ITO), indium zinc oxide (IZO), zinc oxide (ZnO) and indium tin zinc oxide (ITZO).

7. The display device of claim 1, further comprising a thin film transistor on the substrate and connected to the first electrode.

8. The display device of claim 1, wherein the color conversion layer comprises a phosphor.

9. The display device of claim 1, wherein the light emitting element is configured to emit blue light, and
   wherein the color conversion layer comprises:
      a red converter configured to absorb blue light and to emit red light; and
      a green converter configured to absorb blue light and to emit green light.

10. The display device of claim 9, wherein the color conversion layer further comprises a transmitter unit configured to transmit blue light.

11. The display device of claim 9, further comprising a yellow color filter overlapping the red converter and the green converter.

12. A display device comprising:
    a substrate;
    a first electrode on the substrate;
    a light emitting element comprising:
       a first contact electrode connected to the first electrode;
       a first semiconductor layer on the first contact electrode;
       an active layer on the first semiconductor layer;
       a second semiconductor layer on the active layer; and
       a second contact electrode on the second semiconductor layer;
    a second electrode on the light emitting element; and
    a color conversion layer on the light emitting element and the second electrode,
    wherein an upper surface of the first contact electrode has a concavo-convex pattern and a lower surface of the first contact electrode is flat, and
    the first contact electrode, the first semiconductor layer, the active layer, and the second semiconductor layer have a shape substantially the same as a shape of the second contact electrode in a plan view.

13. The display device of claim 12, wherein the concavo-convex pattern comprises a plurality of convex portions and a plurality of concave portions, and wherein each of the plurality of convex portions has a shape of a cone or a polygonal pyramid.

14. The display device of claim 13, wherein an upper surface of the second contact electrode has a concavo-convex pattern, and
   wherein the concavo-convex pattern of the first contact electrode and the concavo-convex pattern of the second contact electrode are positioned alternately with each other.

15. The display device of claim 13, wherein a hypotenuse of the convex portion has an angle of about 20 degrees to about 60 degrees with respect to a bottom surface of the convex portion.

16. The display device of claim 12, wherein the concavo-convex pattern comprises a plurality of convex portions and a plurality of concave portions, and
   wherein each of the plurality of convex portions has a hemispherical shape or a polygonal shape in cross-section.

17. The display device of claim 12, wherein the first semiconductor layer comprises an n-type semiconductor layer, and the second semiconductor layer comprises a p-type semiconductor layer.

18. The display device of claim 12, wherein the first contact electrode comprises a metal material including at least one of Ag, Mg, Al, Pt, Pd, Au, Ni, Nd, Ir, Cr, and Cu, and
   wherein the second contact electrode comprises at least one of indium tin oxide (ITO), indium zinc oxide (IZO), zinc oxide (ZnO), and indium tin zinc oxide (ITZO).

\* \* \* \* \*